(12) United States Patent
Hwang et al.

(10) Patent No.: US 6,352,402 B1
(45) Date of Patent: Mar. 5, 2002

(54) APPARATUS FOR ADJUSTING PITCH OF PICKER

(75) Inventors: Ji Hyun Hwang; Seung Joo Paek, both of Kyungki-do (KR)

(73) Assignee: Mirae Corporation, Choongchunnam-Do (KR)

(*) Notice: Subject to any disclaimer, the term of this patent is extended or adjusted under 35 U.S.C. 154(b) by 0 days.

(21) Appl. No.: 09/610,450

(22) Filed: Jul. 5, 2000

(30) Foreign Application Priority Data

Jul. 9, 1999 (KR) .............................................. 99-27794

(51) Int. Cl.7 ............................. B25J 15/06; B25G 47/91
(52) U.S. Cl. ....................................... 414/752.1; 294/65
(58) Field of Search ......................... 414/752.1; 294/65, 294/87.1, 64.1

(56) References Cited

U.S. PATENT DOCUMENTS 5,575,376 A * 11/1996 Colamussi ........... 414/752.1 X
5,919,024 A *  7/1999 Fujimori ................... 414/752.1
6,145,901 A * 11/2000 Rich ......................... 414/752.1

FOREIGN PATENT DOCUMENTS

GB     2219274   * 12/1989 ............... 414/752.1

* cited by examiner

*Primary Examiner*—Steven A. Bratlie
(74) *Attorney, Agent, or Firm*—Rosenberg, Klein & Lee

(57) ABSTRACT

An apparatus for adjusting a pitch of a picker using a single actuator is provided. The apparatus includes a picker base, a plurality of pickers adapted for varying the pitch of the pickers by use of a linear guide device provided at one side of the picker base. The apparatus includes an actuator for driving the plurality of pickers, and a bevel gear unit coupled to the actuator by upper and lower racks for transmitting the driving force to the plurality of pickers.

4 Claims, 2 Drawing Sheets

APPARATUS FOR ADJUSTING PITCH OF PICKER

BACKGROUND OF THE INVENTION

1. Field of the Invention

The present invention relates to an apparatus for adjusting the pitch of a picker when the picker holds a device having a different pitch size, and more particularly to an apparatus for adjusting the pitch of a picker, by which a device of a different pitch size can be easily held when the produced device is to be moved for tests, without using another picker, for the device, having a different pitch size.

2. Description of the Conventional Art

A handler is generally comprised of: a stacker in which customer trays for containing produced devices are loaded therein; a loading section in which a top customer tray contained in the stacker, individually moved by means of a transfer arm, is seated thereon; an aligner for picking up and holding the devices seated in the loading section by suction using a picker, transferring them and positioning the devices to be aligned; and a pick and place unit for horizontally moving the aligned devices and placing them on a test tray, or for unloading the test-finished devices from the test tray to an empty customer tray.

The handler further comprises the following components: a heating chamber for heating the devices contained in the test tray to the appropriate temperature for tests after the test tray has been moved in one step; a test site where the devices, heated to a temperature suitable for performing the tests, are lowered to contact respective test sockets for electrical connection with a tester; a cooling chamber for cooling the devices to room temperature under constant temperature conditions, after the test tray exiting from the test site is elevated in one step; an unloading section where the test tray exiting from the cooling chamber is placed; and multi-stackers for classifying the devices based upon the test results from the test tray placed on the unloading section and stacking the classified devices.

Testing the devices by use of the handler thus constructed includes the steps of: loading the devices into the customer tray; positioning the devices in order to transfer the devices contained in the customer tray into the heating chamber; heating the devices aligned in the step of positioning the devices, to a temperature suitable for performing the tests; testing the device performance by electrically connecting the heated devices; cooling the test-finished devices to room temperature; and classifying the devices having finished the tests and cooled to room temperature by the test results, and unloading the classified devices.

A variety of apparatuses are used in the processing steps discussed above. In the step of loading the devices, the customer tray used therein is movably provided with a carrier module having cavities formed therein, each cavity being formed by a rectangularly shaped frame body for accommodating the produced device, and a loader stacker in which the customer trays, each containing the devices to be tested, are loaded therein. Also, in the step of positioning the devices, a position setting block is used for aligning the devices, held by suction by means of a picker, from the customer tray loaded in the loader stacker, for further subsequent processing of the aligned devices. The picker horizontally moves the aligned devices and loads them for the heating steps.

The prior art handler has a picker for loading the devices, provided at the heater. Therefore, where different sizes of the devices are being handled, the picker for one size of device must be exchanged with another suitable picker. Such an exchange operation induces inconvenience, as well as increasing the handling time.

Further, a limited range of the picker movement causes inconvenience in the operation of the system. Also, smooth operation of holding the device with suction is not achieved, resulting in breakage of the device.

SUMMARY OF THE INVENTION

Therefore, it is an object of the present invention to provide an apparatus for adjusting a pitch of a picker in a handler, which enables the pitch of the picker used for transferring devices to be tested to be controllably adjusted, so that much smoother operation may be provided. Even for different sizes of devices, the picking operation is made possible, without replacing one picker with another extra picker and damaging the devices during the picking up of the devices.

According to the present invention, there is provided an apparatus for adjusting a pitch of a picker. the apparatus comprises a picker base, a plurality f pickers provided such that a pitch of the picker is varied by means of a linear guide device provided at one side of the picker base, an actuator for driving the plurality of pickers, and bevel gear units coupled to the actuator by upper and lower racks, for transmitting the driving force to the plurality of pickers.

In the apparatus, the linear guide device consists of an LM guide rail and an LM guide block, and is provided to move the pickers in an X-axis direction.

In the apparatus, the actuator for driving the plurality of pickers may be implemented by motor or a fluid actuating cylinder.

In the apparatus, the plurality of pickers are coupled to the respective linear guide devices such that the pickers are movable in a Z-axis direction.

In the apparatus, the bevel gear unit consists of a pair of upper and lower follower bevel gears and a drive bevel gear for driving the upper and lower follower bevel gears. The upper follower bevel gear is coupled to first and second pinions. The lower follower bevel gear is coupled to third and fourth pinions.

In the apparatus, the first and second pinions respectively engage with the upper and lower racks for driving the first and second pickers, and the third and fourth pinions respectively engage with another pair of upper and lower racks for driving the third and fourth pickers.

In the apparatus, the gear ratio between the first and second pinions and between the third and fourth pinions is equal to 1:2.

DETAILED DESCRIPTION OF THE INVENTION

Hereinafter, an apparatus for adjusting a pitch of a picker in accordance with an embodiment of the present invention will be described, with reference to the accompanying drawings.

Figure 1:
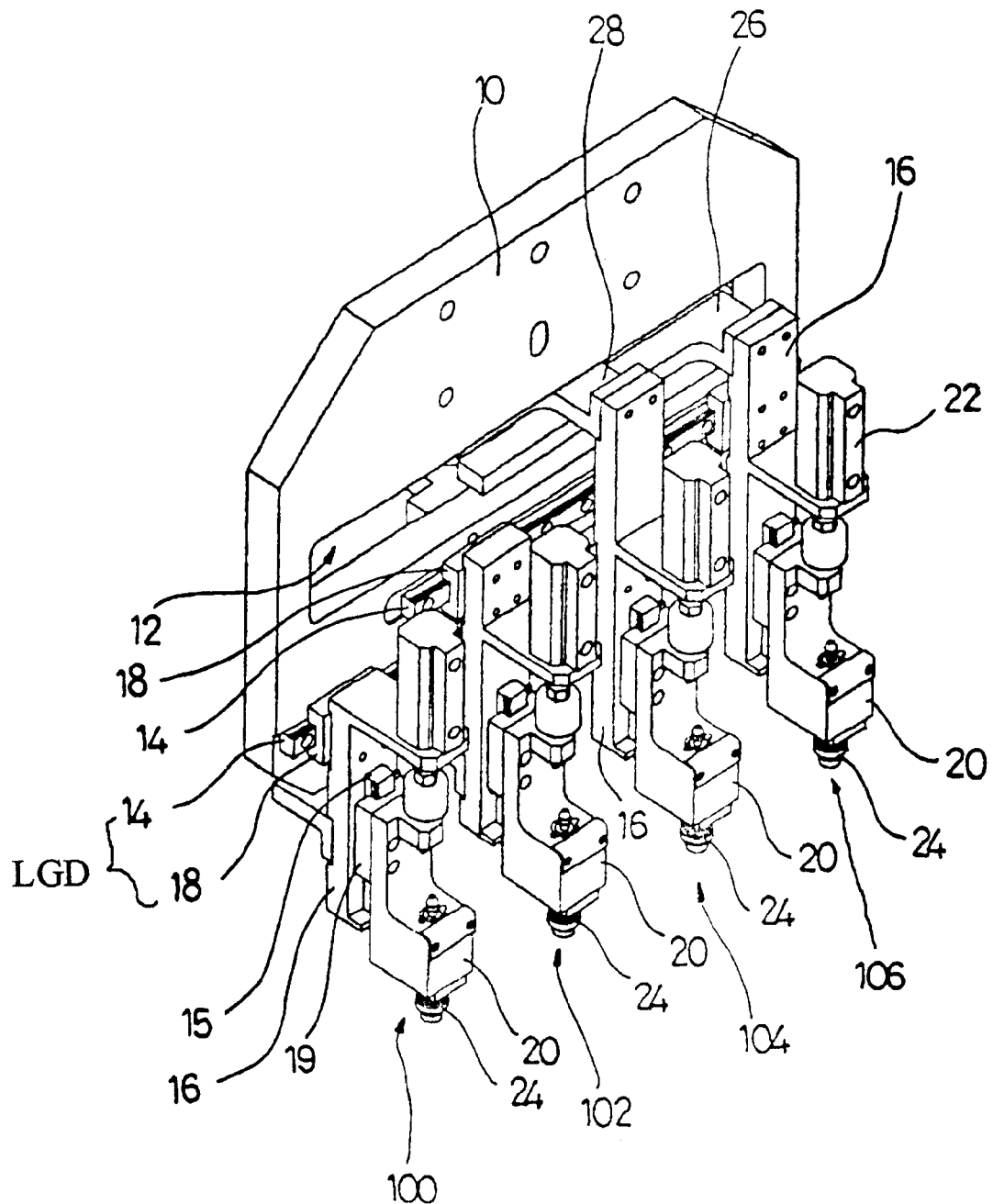
FIG. 1 is a perspective view showing a front portion of an apparatus according to he present invention.
Figure 2:
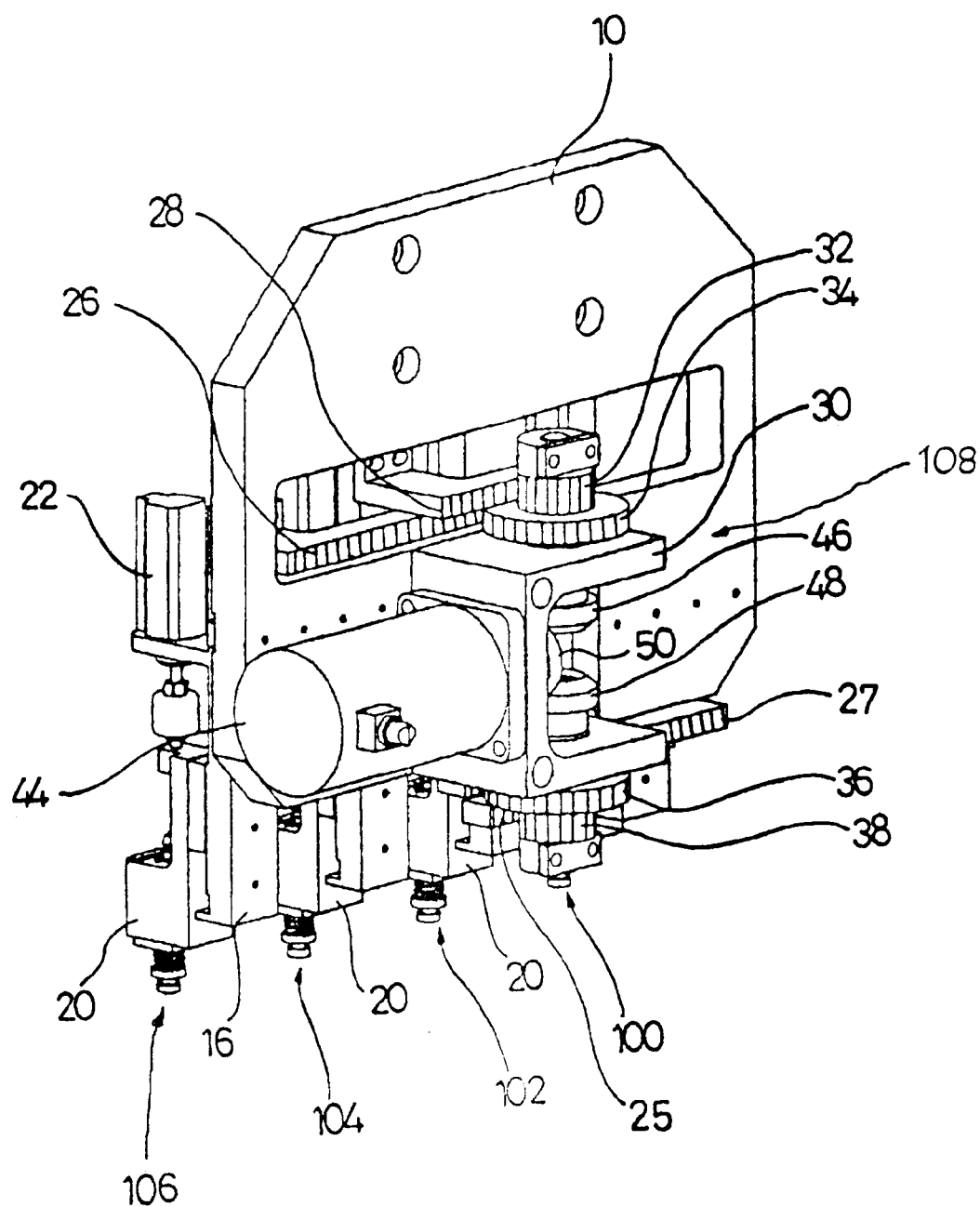
FIG. 2 is a perspective view showing a rear portion of the apparatus according to the present invention.

As shown in FIGS. 1 and 2, the apparatus for adjusting a pitch of a picker comprises a picker base 10; a plurality of pickers 100, 102, 104, 106 provided such that a pitch of the picker is varied by means of a linear guide device provided at one side of the picker base 10. An actuator 22 is respectively provided for driving each of the plurality of pickers, and a bevel gear unit 108 coupled to the actuators 22 by upper and lower racks, for respectively transmitting the driving force to the plurality of pickers 100, 102, 104, 106. The linear guide device (LGD) consists of a linear motion (LM) guide rail 15 and a LM guide block 19, and is provided to move the pickers in an X-axis direction. The actuators 22 for respectively driving the plurality of pickers may be implemented by a motor or a fluid actuating cylinder.

The bevel gear unit 108 consists of a pair of upper and lower follower bevel gears 46, 48 which are engaged with a drive bevel gear 50 provided at one side of the actuators 22, and first and second pinions 32, 34 and third and fourth pinions 38,36 are provided, respectively, on each of end portions of a bevel gear unit bracket 30. The first and second pinions 32, 34 engage with the upper and lower racks 28, 26 for respectively driving the pickers 104, 106. The third and fourth pinions 38, 36 engage with the upper and lower racks 27, 25 for respectively driving the pickers 102, 100. Also, the gear ratio between the first and second pinions and between the third and fourth pinions may be equal to 1:2.

Referring to FIGS. 1 and 2, at a front portion of the picker base 10, there are provided a through-hole 12 longitudinally formed and the LGDs for horizontally moving the plurality of pickers in an X-axis direction. Each of the LGDs consists of a pair of upper and lower LM (linear motion) guide rails 14, each rail being longitudinally fixed to the picker base, and LM guide blocks 18, each of which is coupled to the respective LM guide rails 14 and adapted to be moved in an X-axis direction. The LM guide blocks 18 are fixedly disposed adjacent to rear sides of a respective picker bracket 16.

Further, there are provided LGDs for vertically moving each of picker bodies 20 in a Z-axis direction at one side of each picker bracket 16. The LGD consists of an LM guide rail 15 disposed in a Z-axis direction corresponding to each of the picker brackets 16, and an LM guide block 19 coupled to the LM guide rail 15, for being vertically moved.

Each of the guide blocks 19 faces a respective picker body 20, each of which has a suction nozzle 24. An actuator 22 is provided at an upper side of each picker bracket 16. Each picker body 20 is fixedly coupled to a respective actuator 22, below an axial lower portion of the actuator 22, for vertical movement along the LGD in a Z-axis direction, when the actuator 22 is activated. The suction nozzle 24 provided below the picker body 20 serves to hold a device, such as electronic component, and to move it to a predetermined location.

The right two picker brackets 16 have their respective end portions fixed to upper and lower racks 28, 26, respectively, these being through the longitudinal hole 12 of the picker base 10, while the left two picker brackets 16 have their respective end portions fixed to upper and lower racks 27, 25, respectively, projecting below the picker base 10.

Referring to FIG. 2, there is shown a rear portion of the present invention. As shown in FIG. 2, the bevel gear unit bracket 30 is disposed at the rear portion of the picker base 10, and has one side thereof to which the actuator 44 is installed. A drive bevel gear 50 is disposed at one side of the actuator 44. The bevel gear unit 108, which consists of the drive bevel gear 50 and upper and lower follower bevel gears 46, 48, is disposed inside the bracket 30.

The bevel gear unit bracket 30 has the upper follower bevel gear 46 inside thereof, and first pinion 32 and a second pinion 34, sequentially arranged, external to the bracket 30. The upper follower bevel gear 46 is positioned at the upper portion of the inside of the bevel gear unit bracket 30 in such a manner that it engages the drive bevel gear 50 to be rotated thereby. Also, the lower follower bevel gear 48 is positioned at the lower portion of the inside of the bevel gear unit bracket 30.

Similarly to the above-mentioned upper follower bevel gear 46, the lower follower bevel gear 48 engages the drive bevel gear 50 such that the gear 48 is rotated by the drive bevel gear 50. Also, the fourth and third pinions 36, 38 are sequentially installed at the lower external portion of the bevel gear unit bracket 30.

The first upper pinion 32 engages the upper rack 28 coupled to one side of the picker bracket 16, to which the picker 104 is fixed, thus serving to linearly move the picker 104. The second, lower pinion 34 engages the lower rack 26 coupled to one side of the picker bracket 16 to which the picker 106 is fixed, thus serving to linearly move the picker 106. The third lower pinion 38 engages the lower rack 25 coupled to one side of the picker bracket 16 to which the picker 100 is fixed, thus serving to linearly move the picker 100. The fourth upper pinion 36 engages the upper rack 27 coupled to one side of the picker bracket 16 to which the picker 102 is fixed, thus serving to linearly move the picker 102.

Therefore, each of the pickers can be linearly moved in an X-axis direction by means of a single actuator 44, which allows each picker to be moved by a predetermined distance and thus enables adjustment of their spacing.

In operation, when the actuator 44 is activated, the drive bevel gear 50, provided at one side of the actuator 44, is rotated. Then, both upper and lower follower bevel gears 46, 48, these being engaged with the drive bevel gear 50, are oppositely rotated to each other.

With the upper and lower follower bevel gears 46, 48 being oppositely rotated, the first and second pinions 32, 34 integrally formed with an upper portion of the upper follower bevel gear 46 are rotated, so that the upper and lower racks 28, 26 are linearly moved. Also, the third and fourth pinions 38, 36 integrally formed with a lower portion of the lower follower bevel gear 48 are rotated, so that the upper and lower racks 27, 25 are linearly moved.

The upper and lower racks 28, 26 which are linearly moved by the respective first and second pinions 32,24 move respective picker brackets 16 which in turn move the pickers 104, 106 in one direction. Also, the upper and lower racks 27, 25 which are linearly moved by the respective third and fourth pinions 36, 38 move the respective picker brackets 16 which in turn move the pickers 100, 102 in the other direction. This allows the picker's pitch to be controllably varied by a predetermined distance.

Therefore, according to the present invention, the single actuator 44 can be used to controllably adjust the pitches of four pickers 100, 102, 104, 106.

Therefore, according to the apparatus for adjusting a pitch of a picker in a handler, it is possible to controllably adjust the pitch of the picker used for holding and transferring devices by means of only one single actuator, so that a more smooth picking operation may be provided. Further, reliability is improved by preventing damage to the devices during the picking of the devices.

What is claimed is:

1. An apparatus for adjusting a pitch of a picker, comprising:

a picker base;

a plurality of pairs of pickers displaceably mounted to the picker base by a linear guide device provided on one side of the picker base;

a plurality of rack systems respectively coupled to the plurality of pairs of pickers, each rack system including an upper rack and a lower rack each being coupled to a respective picker of one of the pair of pickers;

an actuator coupled to the picker base for displaceably driving the plurality of pickers; and a bevel gear unit coupled to the actuator and having a plurality of pinion gear pairs each respectively engaged with a respective pair of the upper and lower racks, a first gear of the pinion gear pair engaged with the upper rack having a different gear ratio than a second gear of the pinion gear pair engaged with the lower rack, wherein each pair of pickers is displaced relative to the other pairs of pickers while each picker of a respective pair of pickers is displaced relative to the other picker of the respective pair of pickers to adjust the pitch of the pickers.

2. The apparatus of claim 1, wherein the linear guide device consists of a linear motion guide rail and a linear motion guide block provided to guide movement of the pickers in an X-axis direction.

3. The apparatus of claim 1, wherein the bevel gear unit includes a drive bevel gear rotatably coupled to the actuator; and an upper follower bevel gear and a lower follower bevel gear respectively rotatably engaged with the drive bevel gear for rotation in opposing directions, each of the upper and lower follower bevel gears being coupled to a respective one the pinion gear pairs for rotation therewith.

4. The apparatus of claim 1, wherein the difference in gear ratio between the first gear and the second gear of a respective pinion gear pair is equal to 1:2.

* * * * *